US007429898B2

United States Patent
Akiyama et al.

(10) Patent No.: US 7,429,898 B2
(45) Date of Patent: Sep. 30, 2008

(54) CLOCK SIGNAL GENERATING CIRCUIT, SEMICONDUCTOR INTEGRATED CIRCUIT AND METHOD FOR CONTROLLING A FREQUENCY DIVISION RATIO

(75) Inventors: Toshifumi Akiyama, Asaka (JP); Hiroyuki Kurase, Asaka (JP); Kenji Funamoto, Asaka (JP)

(73) Assignee: Fujifilm Corporation, Tokyo (JP)

( * ) Notice: Subject to any disclaimer, the term of this patent is extended or adjusted under 35 U.S.C. 154(b) by 132 days.

(21) Appl. No.: 11/594,821

(22) Filed: Nov. 9, 2006

(65) Prior Publication Data

US 2007/0103241 A1    May 10, 2007

(30) Foreign Application Priority Data

Nov. 9, 2005    (JP)    ............................. 2005-324306

(51) Int. Cl.
*H03B 1/00*    (2006.01)
*H03L 7/00*    (2006.01)
(52) U.S. Cl. .......................................... 331/74; 331/34
(58) Field of Classification Search .................. 331/74, 331/34, 173
See application file for complete search history.

(56) References Cited

U.S. PATENT DOCUMENTS

| 6,876,262 | B2 * | 4/2005 | Gharpurey et al. | ............ 331/25 |
| 7,230,496 | B2 * | 6/2007 | Irie | ............................. 331/16 |
| 2003/0063184 | A1 * | 4/2003 | Kim | ............................ 347/250 |
| 2003/0201838 | A1 * | 10/2003 | Tam et al. | ...................... 331/74 |
| 2005/0264696 | A1 * | 12/2005 | Ozawa | ........................ 348/537 |
| 2005/0287964 | A1 * | 12/2005 | Tanaka et al. | ............... 455/118 |
| 2006/0119446 | A1 * | 6/2006 | Li | ............................... 331/74 |

FOREIGN PATENT DOCUMENTS

JP    7-134701 A    5/1995

* cited by examiner

*Primary Examiner*—Joseph Chang
(74) *Attorney, Agent, or Firm*—Birch, Stewart, Kolasch and Birch, LLP

(57) ABSTRACT

A clock signal generating circuit is disclosed. The clock signal generating circuit includes: a reference clock signal generating unit for generating a reference clock signal; a plurality of frequency dividing units for carrying out frequency dividing of the reference clock signal and outputting frequency-divided clock signals; a plurality of frequency division ratio storing units for storing frequency division ratios different from each other for the respective frequency dividing units; and a switching unit for switching, synchronously with the reference clock signal, at least one initial frequency division ratio at the frequency dividing units to the frequency division ratios stored in the corresponding frequency division ratio storing units.

6 Claims, 5 Drawing Sheets

CLOCK SIGNAL GENERATING CIRCUIT, SEMICONDUCTOR INTEGRATED CIRCUIT AND METHOD FOR CONTROLLING A FREQUENCY DIVISION RATIO

BACKGROUND OF THE INVENTION

1. Field of the Invention

The present invention relates to a clock signal generating circuit, a semiconductor integrated circuit and a method for controlling a frequency division ratio, which allow changing frequency division ratios of clock signals outputted from a plurality of frequency dividing circuits to different frequency division ratios.

2. Description of the Related Art

With development of higher-speed and larger scale semiconductor integrated circuits in recent years, there are increasing demands for such semiconductor integrated circuits with lower power consumption. The power consumption of semiconductor integrated circuits increases proportionally to the operating frequency thereof. In response to such demands, Japanese Unexamined Patent Application No. 7(1995)-134701 describes a technology in which a semiconductor integrated circuit is provided with a plurality of internal buses. Built-in modules in the circuit are classified according to their individual operating speeds and are respectively connected to their corresponding internal buses for operation. In this manner, modules that need to operate at high-speeds and modules that do not need to operate at high-speeds are separated, thereby reducing power consumption.

In recent years, memories having a high-speed data transfer capability, such as double data rate memories including DDR/DDR2 SDRAMs, have been employed as external memories that operate in conjunction with the above-described type of semiconductor integrated circuits. However, there is a problem in employing this type of high-speed memory that the power consumption of the semiconductor integrated circuit increases if the semiconductor integrated circuit is operated at the operating frequency of the high-speed memory, while on the other hand, the high-speed memory does not operate normally if the high-speed memory is operated at the operating frequency of the semiconductor integrated circuit with the purpose of reducing power consumption.

SUMMARY OF THE INVENTION

In view of the above-described circumstances, the present invention is directed to provide a clock generating circuit and a semiconductor integrated circuit that generate a plurality of clock signals, wherein a frequency division ratio of each clock signal can individually be set, and the frequency division ratios of the clock signals to be outputted can be changed based on set frequency division ratios.

In order to address the above-described problems, a first aspect of the invention is a clock signal generating circuit, which includes a reference clock signal generating means for generating a reference clock signal; a plurality of frequency dividing means for carrying out frequency dividing of the reference clock signal and outputting frequency-divided clock signals; a plurality of frequency division ratio storing means for storing frequency division ratios different from each other for the respective frequency dividing means; and a switching means for switching, synchronously with the reference clock signal, at least one initial frequency division ratio at the frequency dividing means to the frequency division ratios stored in the corresponding frequency division ratio storing means.

A second aspect of the invention is a method for controlling a frequency division ratio for use with a clock signal generating circuit including a reference clock signal generating means for generating a reference clock signal and a plurality of frequency dividing means for carrying out frequency dividing of the reference clock signal and outputting frequency-divided clock signals. The method controls frequency division ratios at the frequency dividing means, and the method includes: setting a different frequency division ratio for each of the frequency dividing means; and switching, synchronously with the reference clock signal, at least one initial frequency division ratio at the frequency dividing means to the set corresponding frequency division ratios.

The frequency division ratios stored in the frequency division ratio storing means may be set through a user input, or may be inputted from an external processor such as a CPU, to be stored.

In the clock signal generating circuit of the first aspect, the switching means may switch at least one of the initial frequency division ratios at the frequency dividing means to the frequency division ratios stored in the corresponding frequency division ratio storing means synchronously with a leading edge or a trailing edge of the reference clock signal.

It should be noted that, when the initial frequency division ratios at the frequency dividing means are switched to the frequency division ratios stored in the frequency division ratio storing means, all of the frequency division ratios at the frequency dividing means may be simultaneously switched, or at least one of the frequency division ratios at the frequency dividing means may be switched.

A third aspect of the invention is a semiconductor integrated circuit, which includes: an internal bus; a module connected to the internal bus and having a predetermined function; a transfer controlling means for controlling data transfer between the internal bus and an external bus; a reference clock signal generating means for generating a reference clock signal; a first clock signal outputting means for carrying out frequency dividing of the reference clock signal to generate a first clock signal and outputting the first clock signal to the module and the transfer controlling means; a first frequency division ratio storing means for storing a frequency division ratio for the first clock signal outputting means; a second clock signal outputting means for carrying out frequency dividing of the reference clock signal to generate a second clock signal and outputting the second clock signal to the transfer controlling means and a module connected to the external bus; a second frequency division ratio storing means for storing a frequency division ratio for the second clock signal outputting means, the frequency division ratio stored in the second frequency division ratio storing means being different from the frequency division ratio stored in the first frequency division ratio storing means; and a switching means for switching, synchronously with the reference clock signal, at least one initial frequency division ratio at the first and the second clock signal outputting means to the frequency division ratios stored in the first and the second frequency division ratio storing means.

A fourth aspect of the invention is a method for controlling a frequency division ratio for use with a semiconductor integrated circuit including an internal bus, a module connected to the internal bus and having a predetermined function, a transfer controlling means for controlling data transfer between the internal bus and an external bus, a reference clock signal generating means for generating a reference clock signal, a first clock signal outputting means for carrying out frequency dividing of the reference clock signal to generate a first clock signal and outputting the first clock signal to the module and the transfer controlling means, and a second clock signal outputting means for carrying out frequency dividing of the reference clock signal to generate a second clock signal and outputting the second clock signal to the transfer controlling means and a module connected to the external bus. The method controls the frequency division ratios at the first and the second clock signal outputting means, and the method includes: setting a different frequency division ratio for each of the first and the second clock signal outputting means; and switching, synchronously with the reference clock signal, at least one initial frequency division ratio at the first and the second clock signal outputting means to the set corresponding frequency division ratios.

The frequency division ratios stored in the first and the second frequency division ratio storing means may be set through a user input, or may be inputted from an external processor such as a CPU, to be stored.

In the semiconductor integrated circuit of the third aspect, the switching means may switch at least one of the initial) frequency division ratios at the first and the second clock signal outputting means to the frequency division ratios stored in the first and the second frequency division ratio storing means synchronously with a leading edge or a trailing edge of the reference clock signal.

It should be noted that, when the initial frequency division ratios at the first and the second clock signal outputting means are switched to the frequency division ratios stored in the first and the second frequency division ratio storing means, the frequency division ratios at the first and the second clock signal outputting means may be simultaneously switched, or either one of the frequency division ratios may be switched.

By providing the frequency division ratio storing means for each of the frequency dividing means in the clock signal generating circuit, the frequency division ratio (frequency) of the signal outputted from each frequency dividing means can independently be controlled. Further, by providing the first and the second frequency division ratio storing means respectively for the first clock signal outputting means that generates the first clock signal to be supplied to each module in the semiconductor integrated circuit and for the second clock signal outputting means that generates the second clock signal to be supplied to the external memory, the frequency division ratios (frequencies) of the first and the second clock signals can independently be controlled.

When clock signals for the memory having a high-speed data transfer capability such as a DDR/DDR2 SDRAM and for the processor connected to the memory are respectively generated and outputted, the clock signal for the memory typically needs to have a frequency higher than the operating frequency of the processor, for normal operation of the memory. If the frequency of the clock signal to be supplied to the processor is increased together with the frequency of the clock signal to be supplied to the memory, power consumption of the processor also increases. By enabling independent control of the frequencies of these two clock signals by independently changing the frequency division ratios of the signals as in the clock generating circuit and the semiconductor integrated circuit as described above, power consumption of the processor can be kept at a predetermined level and high-speed operation of the memory can be maintained at the same time, and performance of the entire system can be improved.

DESCRIPTION OF THE PREFERRED EMBODIMENTS

Figure 1:
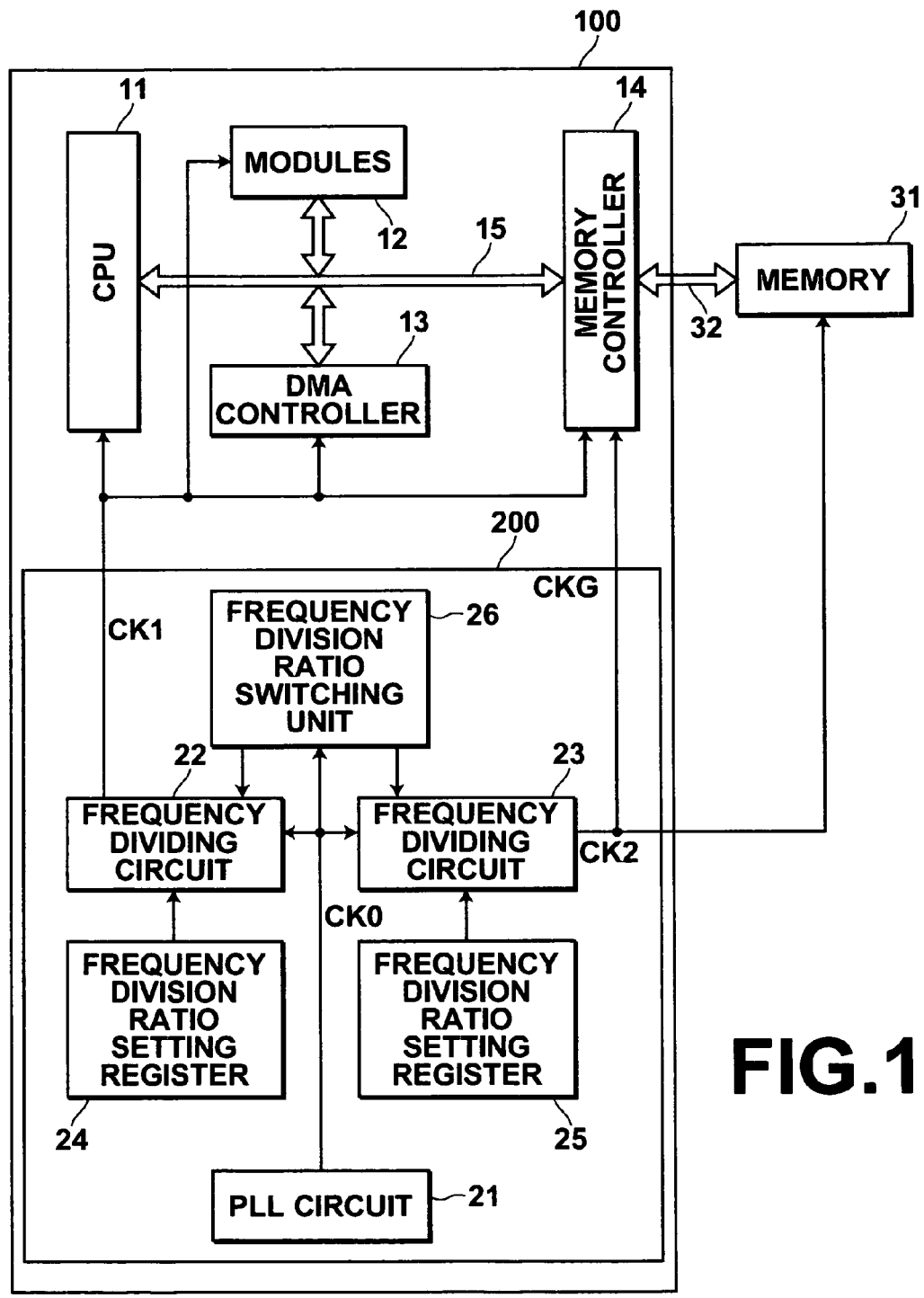
FIG. 1 illustrates an example of the functional configuration of a semiconductor integrated circuit.

Hereinafter, an exemplary embodiment of the present invention will be described with reference to the drawings. FIG. 1 illustrates components of a semiconductor integrated circuit 100 connected to a memory 31 via an external bus 32. The semiconductor integrated circuit 100 includes a CPU 11, modules 12, a DMA (Direct Memory Access) controller 13 and a memory controller 14 corresponding to the transfer controlling means of the invention, which are respectively connected to an internal bus 15. The semiconductor integrated circuit 100 further includes a clock generator corresponding to the reference clock signal generating means of the invention; hereinafter referred to as "CKG") 200 that contains a PLL (Phase-Looked Loop) circuit 21, a frequency dividing circuit 22 corresponding to the frequency dividing means and the first clock signal outputting means of the invention, a frequency dividing circuit 23 corresponding to the frequency dividing means and the second clock signal outputting means of the invention, a frequency division ratio setting register 24 corresponding to the frequency division ratio storing means and the first frequency division ratio storing means of the invention, a frequency division ratio setting register 25 corresponding to the frequency division ratio storing means and the second frequency division ratio storing means of the invention, and a frequency division ratio switching unit 26 corresponding to the switching means of the invention.

The CPU 11 sends/receives data to/from the memory 31 via the memory controller 14, and outputs various instruction signals to the components, such as the modules 12, the DMA controller 13 and the memory controller 14, forming the semiconductor integrated circuit 100.

The modules 12 include circuits that implement various functions such as a timer circuit, an interruption controller circuit, and an image processing circuit.

The DMA controller 13 controls data transfer in a DMA transfer mode, in which data is transferred between the modules 12 and the memory 31 without intervention of the CPU 11.

The memory controller 14 is connected to the internal bus 15 and the external bus 32, and exerts necessary control for data transfer between the memory 31 and the semiconductor integrated circuit 100.

The CKG 200 generates clock signals CK1 and CK2 that are supplied to each component forming the semiconductor integrated circuit 100 and to the memory 31. Specifically, the frequency dividing circuits 22 and 23 carry out frequency dividing based on a reference clock signal CK0 outputted from the PLL circuit 21, and output the clock signals CK1 and CK2. The clock signal CK1 is outputted to the CPU 11, the modules 12, the DMA controller 13, the memory controller 14 and other such components (if any), and the clock signal CK2 is outputted to the memory controller 14 and the memory 31.

The frequency division ratio setting registers 24 and 25 store frequency division ratios for the frequency dividing circuits 22 and 23. The frequency division ratios stored in the frequency division ratio setting registers 24 and 25 may be set through a user input, or the frequency division ratios may be inputted from the CPU 11 or an external processor (not shown) and then is stored. As the frequency division ratios have been registered in the frequency division ratio setting registers 24 and/or 25, the frequency division ratio switching unit 26 outputs instruction signals for switching the initial frequency division ratios at the frequency dividing circuits 22 and 23 to the frequency division ratios stored in the frequency division ratio setting registers 24 and 25.

Figure 2:
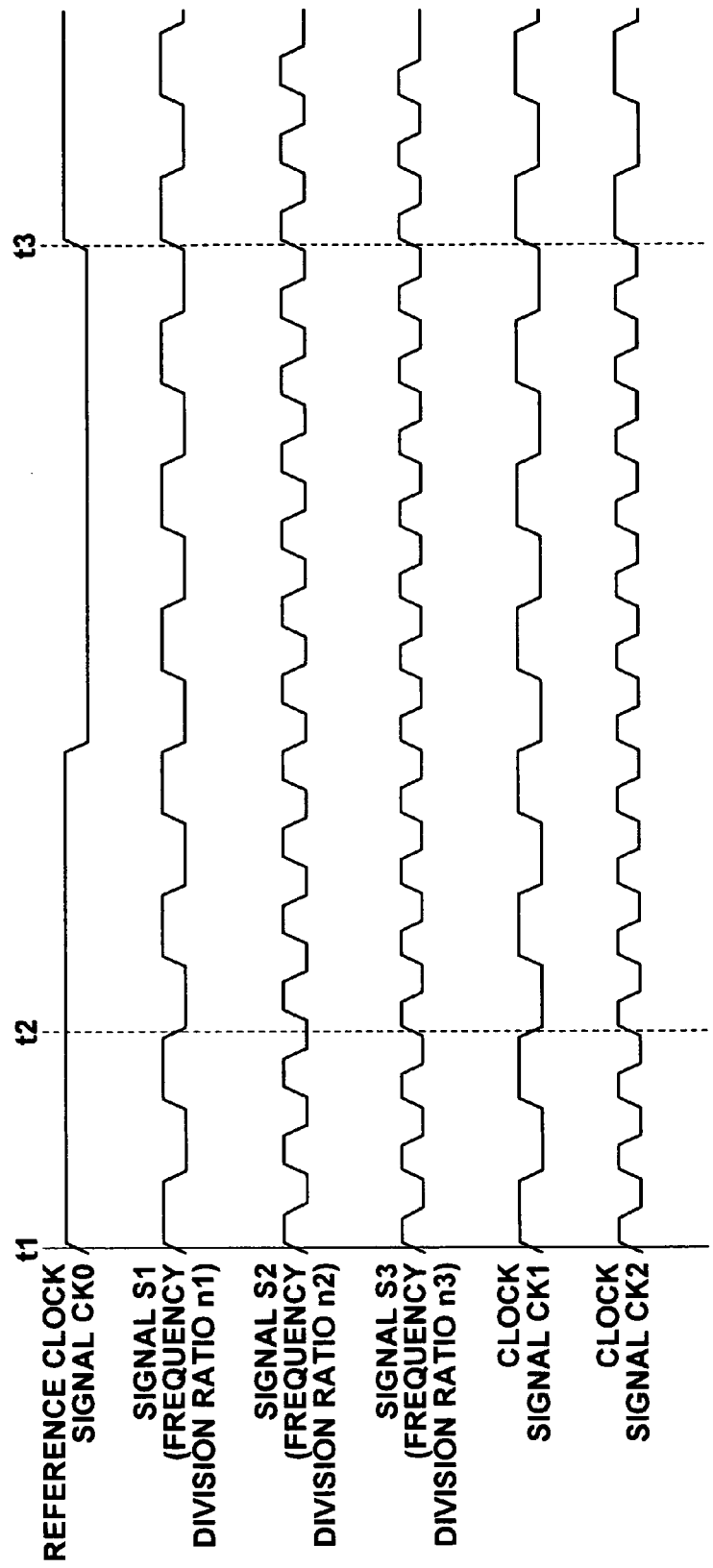
FIG. 2 is a timing chart for a reference clock signal and clock signals.

FIG. 2 is a timing chart for the reference clock signal CK0 and the clock signals CK1 and CK2, and is used herein for explaining timing of switching the frequency division ratios. It is assumed that the signal S1 represents a signal obtained by applying frequency dividing at the frequency division ratio n1 to the reference clock signal CK0, the signal S2 represents a signal obtained by applying frequency dividing at the frequency division ratio n2 to the reference clock signal CK0, and the signal S3 represents a signal obtained by applying frequency dividing at the frequency division ratio n3 to the reference clock signal CK0. The signals S1 to S3 are respectively generated at the frequency dividing circuits 22 and 23. Among the generated frequency-divided signals, signals having predetermined frequency division ratios are outputted as the clock signals CK1 and CK2 at the initial stage. For example, at the time t1, the signal S1 with the frequency division ratio n1 is outputted as the clock signal CK1, and the signal S3 with the frequency division ratio n3 is outputted as the clock signal CK2 from the frequency dividing circuits 22 and 23, respectively. The signals S1 to S3 are examples of the frequency-divided signals obtained by frequency dividing of the reference clock signal CK0. The number and the types of the frequency division ratios are not limited to these examples.

At the time t2, as the frequency division ratios have been stored in the frequency division ratio setting registers 24 and/or 25, the frequency division ratio switching unit 26 begins timing detection of leading edges of the reference clock signal CK0. In this example, the frequency division ratio switching unit 26 detects the timing of the leading edges of the reference clock signal CK0 since frequency dividing for obtaining the signals S1 to S3 is carried out referring to the leading edge of the reference clock signal CK0 as the base point. However, if frequency dividing is carried out referring to the trailing edge of the reference clock signal CK0 as the base point, the frequency division ratio switching unit 26 detects the timing of the trailing edges of the reference clock signal CK0.

Then, at the time t3, as the frequency division ratio switching unit 26 has detected the leading edge of the reference clock signal CK0, the frequency division ratio switching unit 26 outputs instruction signals for instructing switching of the frequency division ratios to the frequency dividing circuits 22 and 23. As the instruction signals have been inputted to the frequency dividing circuits 22 and 23, the frequency dividing circuits 22 and 23 output frequency-divided signals corresponding to the frequency division ratios stored in the frequency division ratio setting registers 24 and 25. For example, if data representing "frequency division ratio=n1" is stored in the frequency division ratio setting register 25, the frequency dividing circuit 23 switches the output signal therefrom as the clock signal CK2 from the signal S3 (with the frequency division ratio n3) to the signal S1 (with the frequency division ratio n1) according to the instruction signal from the frequency division ratio switching unit 26. In this manner, the frequency of the clock signal CK2 is changed, and the clock signal CK2 is inputted to the memory controller 14 and to the memory 31.

It should be noted that, in the timing chart shown in FIG. 2, explanation is made on the case where the frequency division ratio of the clock signal CK2 is changed. However, the frequency division ratio of one of the clock signals CK1 and CK2 may be changed, or alternatively, the frequency division ratios of both of the two signals may be simultaneously changed.

Further, in the above description, the frequency division ratio switching unit 26 outputs the instruction signals to the frequency dividing circuits 22 and 23 when the frequency division ratios have been stored in the frequency division ratio setting registers 24 and/or 25. However, the frequency division ratio switching unit 26 may output the instruction signals to the frequency dividing circuits 22 and 23 when a control signal has been inputted to the frequency division ratio switching unit 26 from the CPU 11 or an external processor, and then the frequency dividing circuits 22 and 23 switch the frequency division ratios based on the frequency division ratios stored in the frequency division ratio setting registers 24 and 25. Furthermore, the frequency division ratio switching unit 26 may output the instruction signals to both of the frequency dividing circuits 22 and 23, or may output the instruction signal only to one of the frequency dividing circuits that needs to switch the frequency division ratio.

In the prior art, a single frequency division ratio setting register is used for storing frequency division ratios for a plurality of frequency dividing circuits. Therefore, frequencies of plurality of clock signals to be generated are only adjustable such that they are integral multiples of each other. However, by providing the frequency division ratio setting registers 24 and 25 respectively for the frequency dividing circuits 22 and 23 as described above, the frequency division ratios for the frequency dividing circuits 22 and 23 can be stored independently from each other, and therefore, any frequency can be set for the clock signals CK1 and CK2.

If the memory 31 is a memory having a high-speed data transfer capability such as a DDR or DDR2 SDRAM, the clock signal CK2 typically needs to have a frequency higher than the operating frequency of the semiconductor integrated circuit 100 for normal operation of the memory 31. By allowing the frequency division ratios for the frequency dividing circuits 22 and 23 to be independently set as in the present embodiment, the frequency of the clock signal CK1 can be set low to keep the power consumption of the semiconductor integrated circuit 100 to a predetermined level, and the frequency of the clock signal CK2 can be set high to maintain the high-speed operation of the memory 31. In this manner, performance of the entire system including the semiconductor integrated circuit 100 and the memory 31 can be improved.

Further, since any frequency division ratios can be stored for the frequency dividing circuits 22 and 23, even if the frequency dividing circuits 22 and 23 are connected, for example, to a new SDRAM having a different operating frequency serving as the memory 31, the frequency of the clock signal CK2 supplied to the SDRAM can readily be changed.

Figure 3:
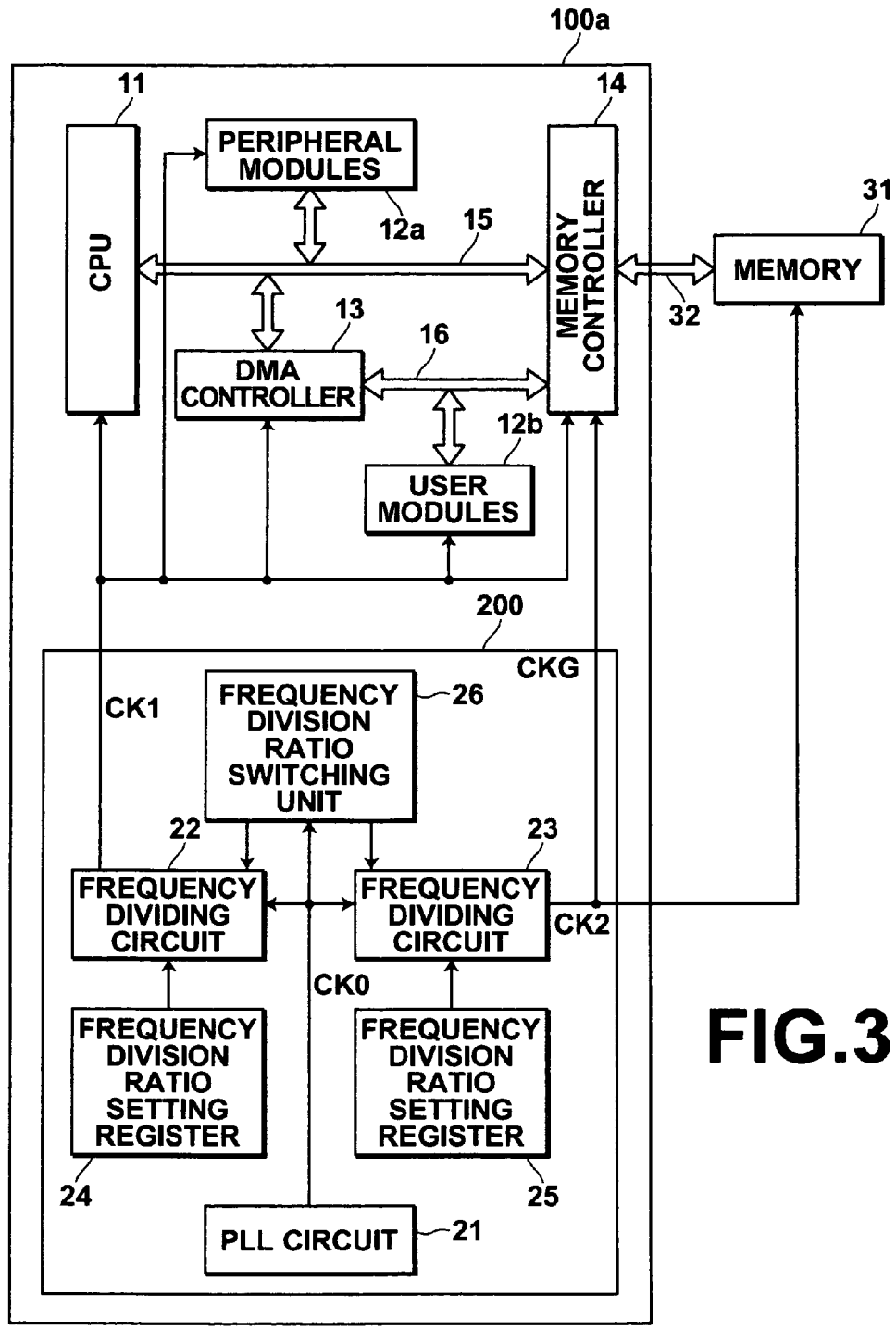
FIG. 3 illustrates another example of the functional configuration of the semiconductor integrated circuit.
Figure 4:
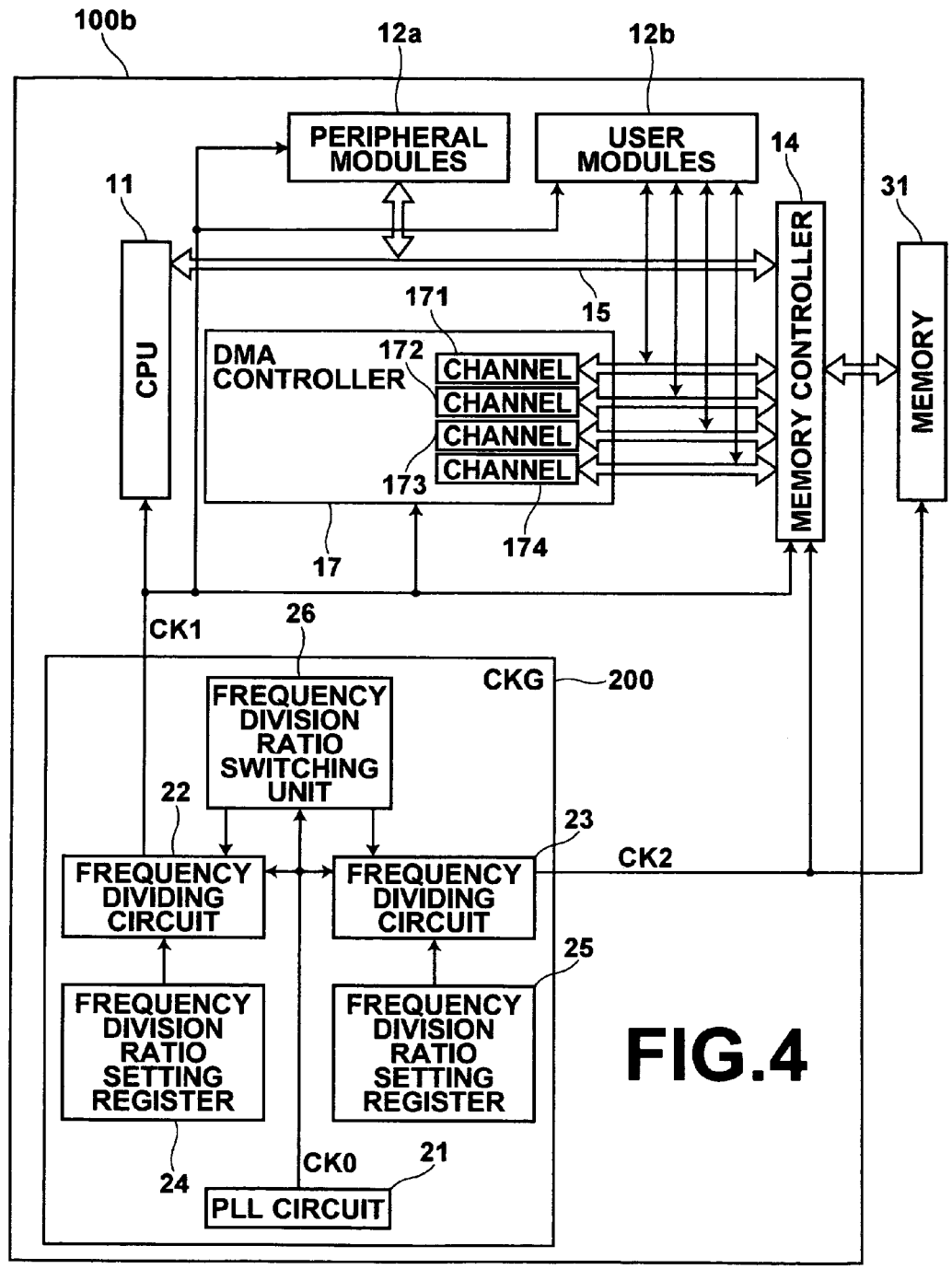
FIG. 4 illustrates yet another example of the functional configuration of the semiconductor integrated circuit.
Figure 5:
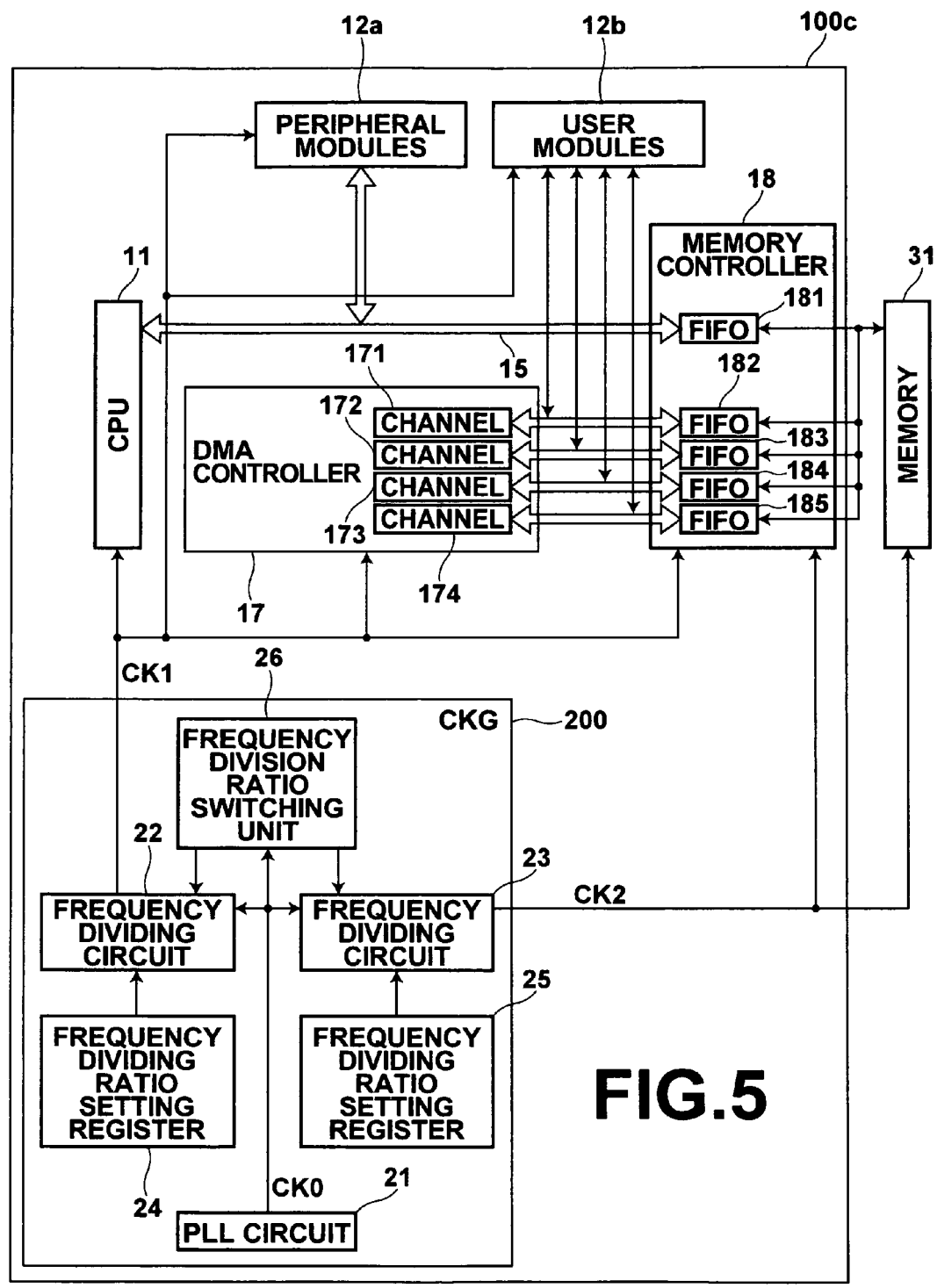
FIG. 5 illustrates still yet another example of the functional configuration of the semiconductor integrated circuit.

It should be noted that the functional configuration of the semiconductor integrated circuit 100 is not limited to that shown in FIG. 1, and those shown in FIGS. 3 to 5 also provide the similar effects. Now, semiconductor integrated circuits 100a to 100c shown in FIGS. 3 to 5 will be described. In the description, components having the same functions as those of the components of the semiconductor integrated circuit 100 are designated by the same reference numerals and explanations thereof are omitted.

FIG. 3 illustrates the configuration of the semiconductor integrated circuit 100a, which includes a dedicated bus 16 provided between the DMA controller 13 and the memory controller 14. In this configuration, peripheral modules 12a include various circuits, such as a timer circuit and an interruption controller circuit, which are necessary for operating the semiconductor integrated circuit 100a. User modules 12b include circuits such as image processing circuits which are arbitrarily connected and disposed by a user. The clock signal CK1 generated at the CKG 200 is supplied to the CPU 11, the peripheral modules 12a, the user modules 12b, the DMA controller 13 and the memory controller 14. In the configuration having only the single internal bus 15 as in the semiconductor integrated circuit 100 shown in FIG. 1, if the user modules 12b frequently access the memory 31 via the DMA controller 13, the bus is occupied for a long time for data transfer between the user modules 12b and the memory 31, and this increases standby time of the CPU 11. By providing the separate dedicated bus 16 for the DMA controller 16 in addition to the internal bus 15, the CPU 11 can efficiently carry out processing.

FIG. 4 illustrates the configuration of the semiconductor integrated circuit 100b, which includes a DMA controller 17 having a plurality of channels (for example, channels 171, 172, 173 and 174), and dedicated buses 161, 162, 163 and 164 respectively provided between their corresponding channels and the memory controller 14. In the case of the semiconductor integrated circuit 100a shown in FIG. 3, which includes the single dedicated bus 16 between the DMA controller 13 and the memory controller 14, when a certain one of the user modules is accessing the DMA controller 14, the other user modules cannot access the DMA controller 14 and have to stand by. By providing the DMA controller 14 with the channels 171-174, and controlling data transfer so that the user modules can arbitrarily access the individual channels, efficient data transfer can be achieved between the user modules 12b and the DMA controller 17.

In order to control data transfer, for example, a control register is provided for each of the channels 171-174, and the control registers store data such as individual IDs of the accessing user modules, amounts of data transfer, amounts of remaining data to be transferred, and flags for enabling or disabling transfer. Based on these data stored in the control registers, The DMA controller 17 perceives processing conditions of the channels 171-174 and availability of the buses, and efficiently allocates any of the channels 171-174 to the user module that has requested data transfer to the memory 31. In this manner, the user modules can transfer data via the corresponding dedicated buses.

FIG. 5 illustrates the configuration of the semiconductor integrated circuit 100c, which includes a memory controller 18 having read/write FIFO buffers (for example, FIFO buffers 181, 182, 183, 184 and 185), and buses respectively provided between the FIFO buffers 181-185 and the CPU 11 as well as the channels 171-174 of the DMA controller 17. The FIFO buffers may be separately provided for reading and for writing, however, for simplicity of the drawing, the read/write FIFO buffers 181-185 to be commonly used for both reading and writing are shown in the present embodiment. The FIFO buffers 181-185 are formed, for example, by SRAMs. Data read out from the memory 31 according to a request from the CPU 11 or the DMA controller 17 is once stored in corresponding one of the FIFO buffers 181-185, and then is outputted to the CPU 11 or the DMA controller 17. On the other hand, data outputted from the CPU 11 or the DMA controller 17 is once stored in corresponding one of the FIFO buffers 181-185, and then is outputted to and stored in the memory 31. Since the memory controller 18 includes the plurality of FIFO buffers, even if there are multiple requests from the CPU 11 and the DMA controller 17, data read out from the memory 31 according to the requests are once stored in the FIFO buffers 181-185, and then are transferred via the buses to the CPU 11 and the DMA controller 17, thereby efficiently processing requests from the CPU 11 and the DMA controller 17. On the other hand, when data is written in the memory 31, even if the CPU 11 and the user modules 12b simultaneously transfer data to the memory 31, the data are once stored in the FIFO buffers 181-185, thereby eliminating standby time of the CPU 11 and the user modules 12b with respect to the memory controller.

What is claimed is:

1. A clock signal generating circuit comprising:
   a reference clock signal generating means for generating a reference clock signal;
   a plurality of frequency dividing means for carrying out frequency dividing of the reference clock signal and outputting frequency-divided clock signals;
   a plurality of frequency division ratio storing means for storing frequency division ratios different from each other for the respective frequency dividing means; and
   a switching means for switching, synchronously with the reference clock signal, at least one initial frequency division ratio at the frequency dividing means to the frequency division ratios stored in the corresponding frequency division ratio storing means.

2. The clock signal generating circuit as claimed in claim 1, wherein the switching means switches at least one of the initial frequency division ratios at the frequency dividing means to the frequency division ratios stored in the corresponding frequency division ratio storing means synchronously with a leading edge or a trailing edge of the reference clock signal.

3. A method for controlling a frequency division ratio for use with a clock signal generating circuit including a reference clock signal generating means for generating a reference clock signal and a plurality of frequency dividing means for carrying out frequency dividing of the reference clock signal and outputting frequency-divided clock signals, the method controlling frequency division ratios at the frequency dividing means, and the method comprising:
   setting a different frequency division ratio for each of the frequency dividing means; and
   switching, synchronously with the reference clock signal, at least one initial frequency division ratio at the frequency dividing means to the set corresponding frequency division ratios.

4. A semiconductor integrated circuit comprising:
   an internal bus;
   a module connected to the internal bus and having a predetermined function;
   a transfer controlling means for controlling data transfer between the internal bus and an external bus;
   a reference clock signal generating means for generating a reference clock signal;
   a first clock signal outputting means for carrying out frequency dividing of the reference clock signal to generate a first clock signal and outputting the first clock signal to the module and the transfer controlling means;

a first frequency division ratio storing means for storing a frequency division ratio for the first clock signal outputting means;

a second clock signal outputting means for carrying out frequency dividing of the reference clock signal to generate a second clock signal and outputting the second clock signal to the transfer controlling means and a module connected to the external bus;

a second frequency division ratio storing means for storing a frequency division ratio for the second clock signal outputting means, the frequency division ratio stored in the second frequency division ratio storing means being different from the frequency division ratio stored in the first frequency division ratio storing means; and a switching means for switching, synchronously with the reference clock signal, at least one of initial frequency division ratio at the first and the second clock signal outputting means to the frequency division ratios stored in the first and the second frequency division ratio storing means.

5. The semiconductor integrated circuit as claimed in claim 4, wherein the switching means switches at least one of the initial frequency division ratios at the first and the second clock signal outputting means to the frequency division ratios stored in the first and the second frequency division ratio storing means synchronously with a leading edge or a trailing edge of the reference clock signal.

6. A method for controlling a frequency division ratio for use with a semiconductor integrated circuit including an internal bus, a module connected to the internal bus and having a predetermined function, a transfer controlling means for controlling data transfer between the internal bus and an external bus, a reference clock signal generating means for generating a reference clock signal, a first clock signal outputting means for carrying out frequency dividing of the reference clock signal to generate a first clock signal and outputting the first clock signal to the module and the transfer controlling means, and a second clock signal outputting means for carrying out frequency dividing of the reference clock signal to generate a second clock signal and outputting the second clock signal to the transfer controlling means and a module connected to the external bus, the method controlling the frequency division ratios at the first and the second clock signal outputting means, and the method comprising:

setting a different frequency division ratio for each of the first and the second clock signal outputting means; and switching, synchronously with the reference clock signal, at least one initial frequency division ratio at the first and the second clock signal outputting means to the set corresponding frequency division ratios.

* * * * *